United States Patent [19]

Kumar

[11] Patent Number: 4,792,788
[45] Date of Patent: Dec. 20, 1988

[54] POSITION INDICATING SYSTEM

[75] Inventor: Ajith K. Kumar, Erie, Pa.

[73] Assignee: General Electric Company, Erie, Pa.

[21] Appl. No.: 124,138

[22] Filed: Nov. 23, 1987

[51] Int. Cl.$^4$ .............................................. H03M 1/22
[52] U.S. Cl. ..................................... 341/15; 324/208
[58] Field of Search .............................. 324/207, 208; 340/347 P; 250/231 SE

[56] References Cited

U.S. PATENT DOCUMENTS

| | | | |
|---|---|---|---|
| 3,197,763 | 7/1965 | Fisher | 340/347 |
| 4,072,893 | 2/1978 | Huwyler | 324/208 |
| 4,157,507 | 6/1979 | Desai et al. | 328/134 |
| 4,274,053 | 6/1981 | Ito et al. | 324/174 |
| 4,328,463 | 5/1982 | Avins | 340/347 P |
| 4,599,561 | 7/1986 | Takahashi et al. | 324/208 |
| 4,658,214 | 4/1987 | Petersen | 324/207 |
| 4,736,187 | 4/1988 | Kibrick | 340/347 P |

Primary Examiner—Charles D. Miller
Attorney, Agent, or Firm—Albert S. Richardson, Jr.

[57] ABSTRACT

A rotatable member having multiple discrete positions between opposite ends of a normal path of movement is provided with two (or three) parallel, encoded tracks having different patterns of distinct, serial sections. These tracks cooperate with relatively stationary probes of a position sensor. As the rotatable member moves from position to position, the sensor will produce a family of two (or three) separate binary signals that changes states as the probes detect boundaries between successive sections of the tracks with which they respectively communicate, and the patterns of the encoded sections are so selected that the sequence of state changes when the rotatable member is approaching a predetermined mid position will differ from the sequence when the member is moving away therefrom.

20 Claims, 12 Drawing Sheets

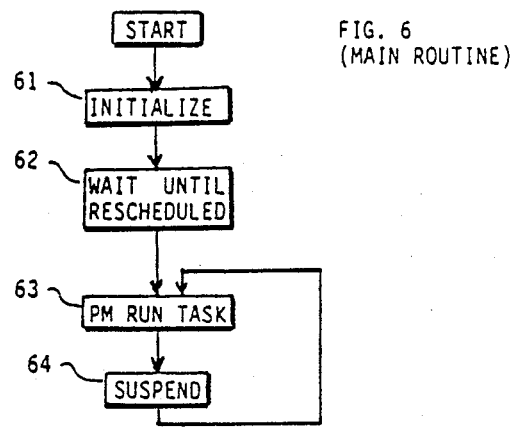
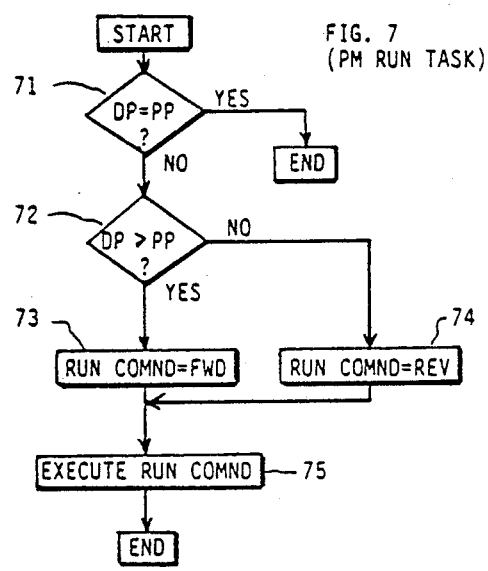

(AUTOMATIC STOP ROUTINE)

(POWER UP ROUTINE)

(GET0/83)

(98)

(TEST DIRECTION/124)

(FIND HOME/147)

(GET2/90)

POSITION INDICATING SYSTEM

BACKGROUND OF THE INVENTION

This invention relates generally to a system for automatically indicating or monitoring the positions of a reciprocally movable object, and more particularly it relates to such a system in which a rotary shaft encoder is used.

Many different systems have heretofore been proposed for detecting and tracking the angular position of a rotatable shaft. Such systems typically use multi-track rotary disc or drum encoders. The encoded tracks can be sensed or "read" either mechanically, optically, or magnetically. If at least two parallel tracks are used, with the encoded pattern of one of the tracks being staggered or out-of-phase with respect to the encoded pattern of a second track, logic means can be provided for identifying the direction of shaft rotation. See, e.g., U.S. Pat. No. 4,157,507.

In the prior art mechanical rotary encoder systems, each track comprises simply a rotatable cam having a plurality of lobes with which the actuating element of a relatively stationary electrical switch or interlock communicates, via a spring-loaded cam follower. In the prior art optical rotary encoders, each track is a series of alternately opaque and transparent segments on a rotatable disc; when aligned with a relatively stationary beam of light, the transparent segments are detected by an associated photo-sensitive element. In the prior art magnetic rotary encoders, each track of a rotary disc or drum is permanently magnetized to provide a series of alternately poled magnetic fields the polarity of which is sensed by a relatively stationary magnetic pickup or search coil adjacent to the track. An example of a magnetic rotary encoder is disclosed in U.S. Pat. No. 4,274,053. Hall effect devices are advantageously used as the polarity sensing elements (see U.S. Pat. No. 4,658,214).

SUMMARY OF THE INVENTION

A general objective of the present invention is to provide an improved system for automatically indicating or monitoring the relative physical displacement between two members, one of which is reciprocally movable along a given path through six or more discrete positions with respect to the other.

Another general objective of this invention is to advance the art of rotary shaft encoders by providing a position indicating system having the capability of finding a predetermined home position of a reciprocally movable member when its initial position is unknown.

Yet another objective is to provide a relatively simple but accurate position indicating system that does not require a high degree of precision to make.

A more specific objective is the provision of an improved system requiring no more than three and preferably only two separate encoding tracks and associated sensors, which system will give unique position information and will positively identify the direction of movement of a shaft that is rotatable in either a forward or a reverse direction to any one of six or more discrete, angular positions.

In carrying out the invention in one form, the relative physical displacement between first and second members is indicated by a system comprising two parallel encoding tracks on the first member, which member is reciprocally movable along a given path through multiple positions with respect to the second member. Each of the two tracks is encoded to form a series of distinct sections extending generally in the direction of the aforesaid path, and these sections are respectively located in accordance with a predetermined pattern that differs from the pattern of the encoded sections of the other track. Two probes are mounted on the second member in communication, respectively, with the two encoding tracks, with each probe being adapted to discriminate between successive sections of the corresponding track as the first member moves from position to position. The probes are part of a position sensor that is operative to produce a family of two separate binary signals the present states of which depend, respectively, on which encoded sections of the tracks the probes last communicated with, whereby the state of each of the binary signals will change each time the corresponding probe senses a different encoded section as the first member moves from position to position.

The predetermined patterns of the encoded sections of the respective tracks are so selected that the family of binary signals will change states in a first predetermined repetitive sequence so long as the first member is moving in a direction toward a predetermined "transition" position. The transistion position of the first member is in between a first position at one end of the normal travel of this member and a last position at the opposite end of normal travel. The predetermined patterns of the respective tracks are further selected so that the state changes of the aforesaid family occur in a second predetermined repetitive sequence different than the first sequence so long as the first member is moving in a direction away from its transition position toward either end position, and a third unique sequence different than either the first or second sequence whenever the first member is moving in either direction through a predetermined limited portion of its travel that includes the transition position.

For decoding the aforesaid family of binary signals, the displacement indicating means of this invention additionally includes means responsive to each state change of such signals for finding the actual state of the family, and means for remembering the state of the family immediately prior to the actual state. First logic means is provided to determine whether or not the sequence of actual state changes matches the aforesaid first predetermined sequence, thereby indicating whether or not the first member is traveling toward or away from the aforesaid transition position. Second logic means is provided to determine if the sequence of actual state changes matches the aforesaid third unique sequence, thereby indicating whether or not the first member is traversing its transition position.

The first member is coupled to controllable drive means adapted to move it in either a forward direction (from the first position to the last position) or in a reverse direction on command. To move the first member from an unknown initial position to a predetermined home position, the displacement indicating system of this invention further includes means operative while the first member is in its initial position for finding the present state of the family of binary signals, direction testing means associated with the last-mentioned means for commanding the drive means to move the first member one position from its initial position in a selected direction, and searching means responsive to the operation of the aforesaid first logic means for commanding the drive means to move the first member either in the aforesaid selected direction if the sequence of actual state changes matches the first predetermined sequence, or in the opposite direction if the sequence of actual state changes does not match the first sequence. The system also includes means responsive to the operation of the aforesaid second logic means for commanding the drive means to stop the first member in a new position next to the transition position when the sequence of actual state changes matches the third unique sequence. Preferably the aforesaid searching means is effective to determine the new position as a function of the actual direction (forward or reverse) commanded. Means is provided for testing if the new position is the same as the home position and for commanding the drive means to move the first member from its new position to the home position if this test is negative.

The invention will be better understood and its various objectives and advantages will be more fully appreciated from the following detailed description taken in conjunction with the accompanying drawings.

BRIEF DESCRIPTION OF THE DRAWINGS

FIGS. 6-9 and 9A are flow charts that explain the manner in which the operation of the drive means for changing the position of the movable member of FIG. 1 or 2 is controlled.

DETAILED DESCRIPTION

Figure 1:
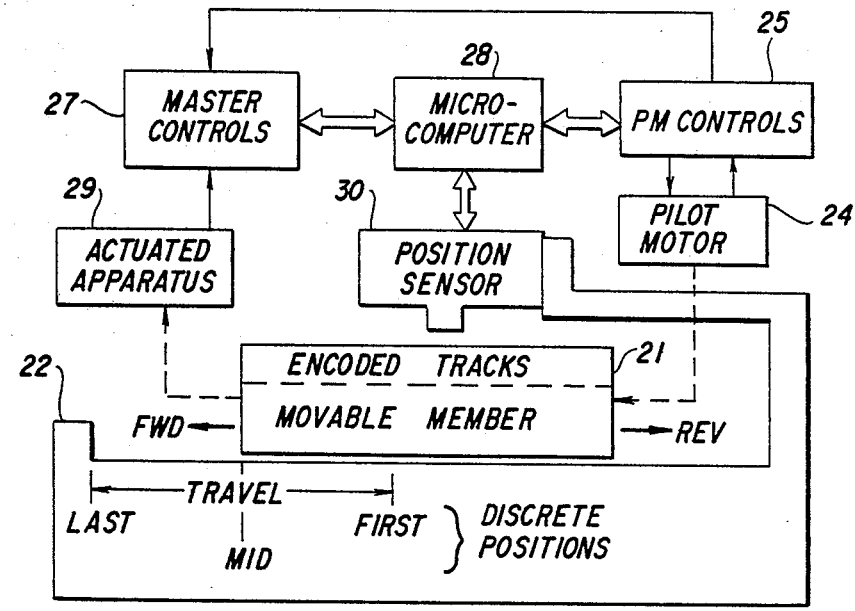
FIG. 1 is a schematic diagram of a reciprocally movable member, its drive means, and a position indicating system embodying the present invention.

With reference now to FIG. 1, the block 21 represents a first member, body or object that is suitably disposed for reciprocal movement along a given path, in either a forward or a reverse direction, with respect to a relatively stationary member 22. The movable member 21 can repose at any one of six or more different positions, including first and last positions at opposite ends of its normal travel. In FIG. 1 it is shown in a predetermined intermediate or mid position in between the first and last positions. Although a linear or straight-line path of movement has been shown in FIG. 1 for the sake of drawing simplicity, in practice the member 21 will usually be affixed or otherwise coupled to a rotary shaft for angular movement along an arcuate or circular path that is concentric with the axis of the shaft, in which case the other member 22 will be structurally connected to or a part of the frame or base on which the housings of the shaft bearings are supported.

The movable member 21 can be moved from position to position, in either a forward or a reverse direction, by controllable drive means to which it is suitable coupled. The drive means comprises a conventional pilot motor 24 (PM) and associated PM controls 25. Typically a direct-current motor having armature and field windings is used as the pilot motor, and its shaft is coupled to the movable member 21 through a reduction gearbox (not shown). On command, the controls 25 will energize the windings of the pilot motor with electric current having the proper magnitude and direction to cause movement of the member 21 from one position to another in the commanded direction. The PM controls 25 receives commands from master controls 27, via a data processing microcomputer 28 or the like. The commands issued by the master controls 27 are normally determined by external factors such as the position of a manually controlled operating handle and/or the output of automatic control equipment (not shown). The microcomputer 28 is actually a coordinated system of commercially available components and associated electrical circuits and elements that can be programmed to perform a variety of desired functions.

In a typical microcomputer, a central processing unit (CPU) executes an operating program stored in an erasable and electrically reprogrammable read only memory (EPROM) which also stores tables and data utilized in the program. Contained within the CPU are conventional counters, registers, accumulators, flip flops (flags), etc. The microcomputer also includes a random access memory into which data may be temporarily stored and from which data may be read at various address locations determined by the program stored in the EPROM. These components are interconnected by appropriate address, data, and control buses which in turn are interconnected with the external circuits of FIG. 1 by conventional peripheral and interface components. In a practical embodiment of the invention, an Intel 8086 microprocessor can be used.

As a member 21 moves from position to position, a sequence of external events is initiated by position responsive apparatus associated therewith. Such apparatus is represented by a block 29 in FIG. 1. As a practical example, the apparatus 29 comprises a bank of electric power switches or contactors that are selectively opened and closed by the action of cooperating cams connected at various angular positions to the same rotating shaft that moves the member 21.

Figure 2:
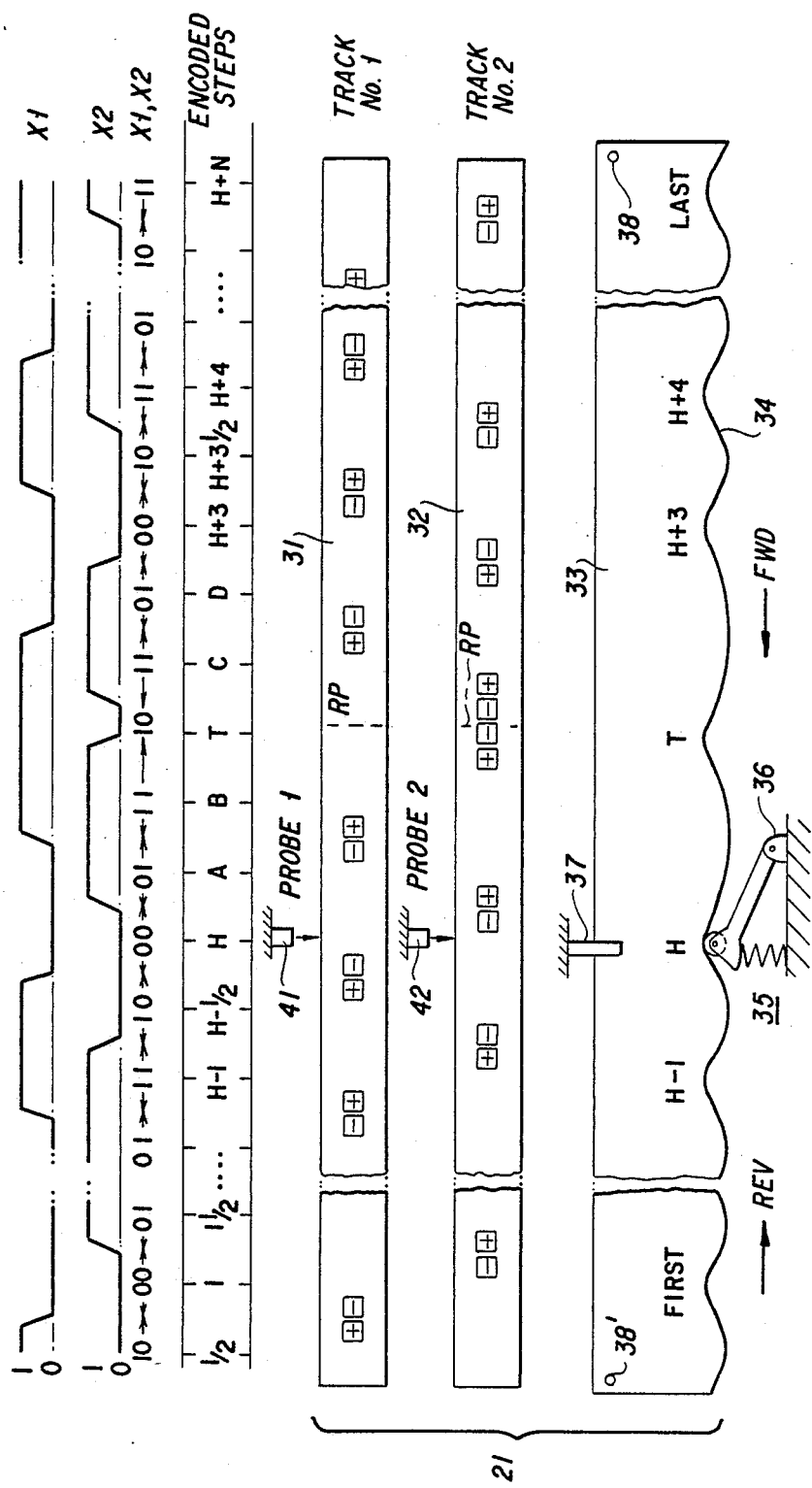
FIG. 2 comprises a simplified two-dimensional projection, truncated in two places, of a reciprocally movable member having two tracks that are magnetically encoded in accordance with the preferred embodiment of the invention, and traces representing the binary signals that will be produced by the associated position sensor as its two probes scan the respective tracks upon movement of the movable member to its various discrete positions.

To indicate its position, the movable member 21 is provided with at least two parallel encoding tracks, and a position sensor 30 having at least two probes is associated therewith. The probes of the position sensor are affixed to or mounted on the relatively stationary member 22 in proximity to and facing the respective encoding tracks. As will be explained in more detail when FIG. 2 is described, each of these tracks is encoded to form a series of distinct sections extending generally in the direction of the path of movement of the member 21, with the respective sections thereof being located in accordance with a predetermined pattern that differs from the pattern of the encoded sections of any other track. Each of the probes of the position sensor 30 is adapted to sense the nearest encoded section of the corresponding track and to be selectively responsive to successive sections thereof as the member 21 moves from one position to another.

The position sensor includes signal processing means connected to the respective probes for producing a family of at least two separate electrical output signals characterized by alternately high ("1") and low ("0") levels or states. Such 2-level signals are herein referred to as binary signals. Their states depend, respectively, on which encoded sections of the tracks are being sensed by the probes, whereby the state of each signal will change each time the corresponding probe senses a different encoded section as the member 21 moves from position to position. The family of binary output signals of the position sensor 30 is supplied to the microcomputer 28 which is suitably programmed, in a manner that will soon be explained, to decode these signals and to derive position indicating information therefrom.

Either mechanical, optical or magnetic means can be used for encoding the tracks of the movable member 21 and for sensing the encoded sections thereof. In the presently preferred embodiment of this invention, a magnetic encoding technique is used. This is illustrated in FIG. 2 where the movable member 21 has been divided into three parts: a first encoding track 31, a second parallel encoding track 32, and a body 33. The body 33 has a series of valleys or notches in an undulating edge 34 that is engaged by a roller at the distal end of a pivotally-mounted, spring-loaded arm of a load pawl 35. The load pawl is attached to a relatively stationary bracket 36, and in cooperation with the notches of the edge 34 it defines the respective positions of the movable member 21. In effect, the pawl 35 is part of the drive means for the movable member. If this member were not in one of its predetermined discrete positions when the pilot motor 24 is deenergized, the spring-loaded pawl would co-act with an inclined surface of the edge 34 of the body 33 to apply a force tending to move the member 21 until the roller rests solidly in the bottom of the closest notch of this edge.

In FIG. 2 the movable member 21 is shown in a predetermined "home" position (H) which preferably is next to a "transition" position (T) and is between T and the first position. The member 21 is adapted to be moved in a forward direction (FWD) from position H, through position T and a succession of other discrete positions, to the last position (H+N), but further movement in this direction is prevented by suitable stop means which in FIG. 2 is illustrated simply as a stationary abutment 37 in the path of movement of an interference pin 38 on the body 33. The member 21 is also adapted to be moved in a reverse direction (REV) from position H, through a succession of other discrete positions, to the first position (1), but further movement in the reverse direction is prevented by the aforesaid stop means which in this case comprises the abutment 37 in the path of movement of an interference pin 38' on the same body 33.

In the presently preferred embodiment, the movable member 21 has only the two encoding tracks 31 and 32 that are illustrated in FIG. 2, and each of these tracks is permanently magnetized to form a series of distinct sections having magnetic fields of alternately positive (+) and negative (−) polarity. The respective sections of the first track are located in accordance with a first predetermined pattern, and the respective sections of the second track are located in accordance with a second predetermined pattern that differs from the first pattern. The presently preferred patterns are partially shown in FIG. 2 and are more fully developed in Table 1 below. In this embodiment the probes of the associated position sensor 30 comprise magnetic polarity sensing elements, preferably well-known Hall devices. As is indicated in FIG. 2, the first probe 41 is in communication with the first track 31, being mounted so as to intersect the magnetic field eminating from this track, and the second probe 42 is in communication with the second track 32, being similarly mounted so as to intersect the magnetic field eminating therefrom.

Each of the probes 41 and 42 is adapted to discriminate between successive, oppositely-poled magnetized sections of the corresponding track as the member 21 moves from position to position, and the position sensor is operative to produce a family of only two binary signals X1 and X2 which have either 1 or 0 states depending on the polarity of the encoded sections that the probes last communicated with. Each probe is so arranged that when the movable member is in its transition position T, the probe communicates with the corresponding track at a predetermined reference point (RP) having positive polarity on the first track 31 and having negative polarity on the second track 32, and in this position the binary signals X1 and X2 produced by the signal processing means of the position sensor 30 will be 1 and 0, respectively. As the member 21 moves between position T and any other discrete position, each probe is effective to scan the corresponding track, and the family of binary signals, X1,X2 changes states each time either probe senses a polarity change.

With the exception of a predetermined limited zone of the second encoded track 32 embracing the reference point RP, the number of distinct sections in each track is preferably the same as the number of discrete positions of the movable member 21, whereby each of the binary signals X1 and X2 will have a single state change or transition as the member 21 moves from one discrete position to the next. As illustrated in FIG. 2, the encoded sections are located so that the transitions of X1 are staggered with respect to the transitions of X2 and so that such transitions respectively straddle the discrete positions of the movable member. The above-mentioned limited zone of the second track 32 has three distinct sections, whereby the signal X2 will have two transitions as the member 21 moves from position T to the next discrete position in either direction. Consequently, the family of binary signals X1,X2 will change states at two different times upon movement of the member 21 from any one of its discrete positions to the next discrete position, and at a third time if such movement were from position T in either a forward or a reverse direction. When the member 21 reaches its home position H the first probe 41 communicates with a negatively encoded section of the first track 31, the second probe 42 also communicates with a negatively encoded section of the second track 32, and the family of binary signals X1,X2 is in a 00 state.

In FIG. 2 the different states of the family of binary signals at various positions of the movable member 21 are shown under the two traces X1 and X2, and these four alternative states are more fully developed in the following table:

TABLE 1

| DISCRETE POSITIONS | ENCODED STEPS | BINARY CODE | |
|---|---|---|---|
| | | T1 | T2 |
| STOP | — | 1 | 0 |
| | ½ | 1 | 0 |
| 1 | 1 | 0 | 0 |
| | 1½ | 0 | 1 |
| 2 | 2 | 1 | 1 |
| | 2½ | 1 | 0 |
| 3 | 3 | 0 | 0 |
| | 3½ | 0 | 1 |
| . | . | . | . |
| . | . | . | . |
| . | . | . | . |
| | H − 1½ | 0 | 1 |
| H − 1 | H − 1 | 1 | 1 |
| | H − ½ | 1 | 0 |
| H ... | H ... | 0 ... | 0 |
| | A | 0 | 1 |
| | B | 1 | 1 |
| T ... | T ... | 1 ... | 0 |
| | C | 1 | 1 |
| | D | 0 | 1 |
| H + 3 ... | H + 3 ... | 0 ... | 0 |
| | H + 3½ | 1 | 0 |
| H + 4 | H + 4 | 1 | 1 |
| . | . | . | . |
| . | . | . | . |
| . | . | . | . |
| H + N − 2 | H + N − 2 | 1 | 1 |
| | H + N − 1½ | 0 | 1 |
| H + N − 1 | H + N − 1 | 0 | 0 |
| | H + N − ½ | 1 | 0 |
| H + N | H + N | 1 | 1 |
| STOP | — | — | — |

In the two Binary Code columns of Table 1, the alternate 1 and 0 states of the binary signal X1 (corresponding, respectively, to the alternate + and − polarities of the magnetically encoded sections of the first track 31, as detected by the first probe 41 at various positions of the movable member 21) are listed under the heading "T1," whereas the alternate 1 and 0 states of the binary signal X2 (corresponding, respectively, to the alternate + and − polarities of the encoded sections of the second track 32, as detected by the second probe 42 at such positions) are listed under the heading "T2." Since the family of binary signals X1,X2 changes states two times between successive discrete positions of the movable member, (plus a third time between position T and the discrete position on either side thereof), the number of encoded steps is more than twice the number of discrete positions, and therefore halfway between any two successive discrete positions the family of binary signals has a different state than at either of those two positions. The states at the half steps are illustrated in both Table 1 and FIG. 2. In the vicinity of the transition position T, there are two half steps between this position and the next position on either side thereof. Moving forward from the home position H, the encoded step H+½ is herein called step A; step H+1 is herein called B, step H+1½ is the same as the transition position T, step H+2 is herein called C, step H+2½ is herein called D, and step H+3 is the next discrete position. Preferably H is an odd number (e.g., 17), and N is an even number (e.g., 12).

From FIG. 2 and Table 1 it is apparent that the state changes of the family of binary signals will occur in a first repetitive sequence 00, 01, 11, 10 . . . so long as the member 21 is moving in a direction from either end of its normal travel toward position T, a second, different repetitive sequence 00, 10, 11, 01 . . . so long as the member 21 is moving in a direction away from position T toward either end position, and a third unique sequence 11, 10, 11 whenever the member 21 is moving in either direction through a predetermined limited portion of its travel that includes position T. The limited portion of travel is the transition zone wherein the negatively-encoded reference point RP of the second track 32 and the oppositely-encoded sections on either side thereof are scanned by the second probe 42.

Preferable, as shown, the state of the family of binary signals when the movable member 21 is in position 1 differs from the state when this member is in position H+N, and the state when the movable member is in position 1 or in any odd-numbered position between positions 1 and T is the same as the state (e.g., 00) when this member is in any even-numbered position between T and H+N but is not the same as the state (e.g., 11) when the movable member is in any even-numbered position between 1 and T or odd-numbered position higher than T.

Figure 3:
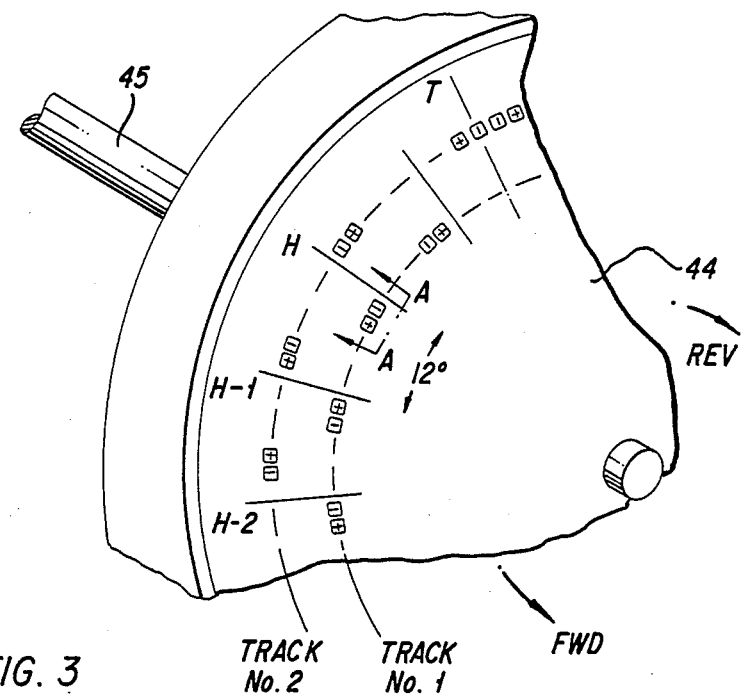
FIG. 3 is a perspective view of a fragment of a magnetically encoded two-track rotary disc having the encoded patterns of the two tracks shown in FIG. 2.
Figure 3A:
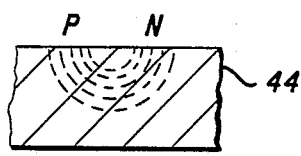
FIG. 3A is an enlarged view of section A—A of the FIG. 3 disc.
Figure 4:
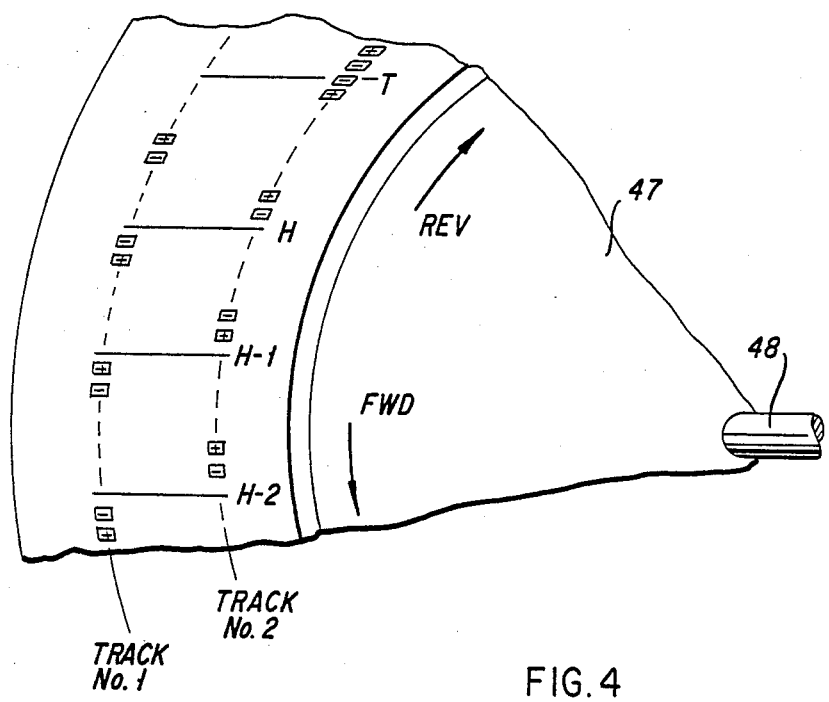
FIG. 4 is a perspective view of a fragment of a magnetically encoded two-track rotary drum having the same patterns as the FIG. 3 disc.

In usual practice, as previously mentioned, the reciprocally movable member 21 is actually rotatable through an arcuate or circular path. Consequently, the magnetically encoded tracks 31 and 32 shown schematically in FIG. 2 will actually be provided on two concentric, annular surfaces of the member 21. One such embodiment is illustrated in FIG. 3 wherein the movable member is a disc 44 of magnetizable material driven by a rotary shaft 45, and another embodiment is illustrated in FIG. 4 wherein the movable member is a drum 47 of magnetizable material driven by a rotary shaft 48. In either case, between the first and last positions of the rotatable member each discrete angular position is spaced from the next one by a predetermined gap (e.g., approximately 12° in a 28-position member), except position T where the gap is 50% larger (e.g., 18°). Suitable magnetizing means (not shown) is used to record magnetic poles of alternate polarities (either north-south or south-north) on successive sections of esch of two annular tracks on the face of the disc 44 (or on the cylindrical surface of the drum 47). FIG. 3A shows the resulting magnetic field in the disc 44 at one of these pole pairs. It will be apparent that the pole pairs in the first track are staggered with respect to those in the second track, and all of the pole pairs are so located that one or the other of the two probes (e.g., Hall effect devices) associated with the respective tracks will detect a polarity change as the rotatable member moves through a position that is in between any discrete position thereof (except T) and the half-way point of its excursion between consecutive discrete positions.

In an alternative embodiment of the invention, three parallel encoding tracks are provided on the reciprocally movable member. The three tracks are respectively encoded to form distinct sections located in accordance with three different predetermined patterns. The three patterns are so selected that the family of binary signals produced by an associated three-probe position sensor will change states once as the movable member moves from any discrete position to the next one. An example of the different states of the family at various positions of the movable member in this embodiment is disclosed in the following Table 2:

TABLE 2

| DISCRETE POSITIONS | ENCODED STEPS | BINARY CODE | | |
|---|---|---|---|---|
| | | T1 | T2 | T3 |
| STOP | — | 1 | 1 | 1 |
| 1 | 1 | 0 | 1 | 1 |

TABLE 2-continued

| DISCRETE POSITIONS | ENCODED STEPS | BINARY CODE | | |
|---|---|---|---|---|
| 2 | 2 | 0 | 1 | 0 |
| 3 | 3 | 0 | 0 | 0 |
| 4 | 4 | 1 | 0 | 0 |
| 5 | 5 | 1 | 1 | 0 |
| 6 | 6 | 1 | 1 | 1 |
| 7 | 7 | 0 | 1 | 1 |
| . | . | . | . | . |
| . | . | . | . | . |
| . | . | . | . | . |
| H − 3 | H − 3 | 0 | 1 | 0 |
| H − 2 | H − 2 | 0 | 0 | 0 |
| H − 1 | H − 1 | 1 | 0 | 0 |
| H... | H... | 1 | 0 | 1 |
|  | H + 1 | 1 | 1 | 1 |
| T... | T... | 1 | 1 | 1 |
|  | H + 2 | 1 | 1 | 1 |
| H + 3... | H + 3... | 1 | 1 | 0 |
| H + 4 | H + 4 | 1 | 0 | 0 |
| H + 5 | H + 5 | 0 | 0 | 0 |
| H + 6 | H + 6 | 0 | 0 | 1 |
| H + 7 | H + 7 | 0 | 1 | 1 |
| H + 8 | H + 8 | 1 | 1 | 1 |
| H + 9 | H + 9 | 1 | 1 | 0 |
| . | . | . | . | . |
| . | . | . | . | . |
| . | . | . | . | . |
| H + N − 1 | H + N − 1 | 0 | 0 | 0 |
| H + N | H + N | 0 | 0 | 1 |
| STOP | — | — | — | — |

In the three Binary Code columns of Table 2, the alternate 1 and 0 states of the binary signal produced in response to the first probe detecting distinct sections of the first encoded track at various positions of the movable member are listed under the heading "T1," the alternate 1 and 0 states of the binary signal produced in response to the second probe detecting distinct sections of the second encoded track at such positions are listed under the heading "T2," and the alternate 1 and 0 states of the binary signal produced in response to the third probe detecting distinct sections of the third track at such positions are listed under the heading "T3." In this embodiment the number of encoded steps is virtually the same as the number of discrete positions of the movable member.

From Table 2 it is apparent that the state changes of the family of binary signals will occur in a first repetitive sequence 000, 100, 110, 111, 011, 010... so long as the movable member is moving in a forward direction toward position H from a lower-numbered position, a second repetitive sequence 000, 100, 110, 111, 011, 011... so long as the movable member is moving in a reverse direction toward position H from a higher-numbered position, a third repetitive sequence 000, 010, 011, 111, 110, 100... so long as the movable member is moving in a reverse direction away from position H toward position 1, a fourth repetitive sequence 000, 001, 011, 111, 110, 100... so long as the movable member is moving in a forward direction from position H toward a higher position, a fifth sequence 100, 101 when the movable member is moving in a forward direction through a predetermined limited portion of its travel that includes position H, and a sixth sequence 111, 101 when the movable member is moving in a reverse direction through another limited portion of its travel that includes position H. Preferably, as is shown in Table 2, the state of the family of binary signals when the movable member is in position H differs from the state of the family at any other position. This embodiment of the invention can be advantageously used, in conjunction with appropriate decoding means, to positively detect the home position of the movable member and to indicate, as the movable member is moving from positive to position, whether or not it is approaching the home position and whether or not it is moving in a forward direction.

Figure 5:
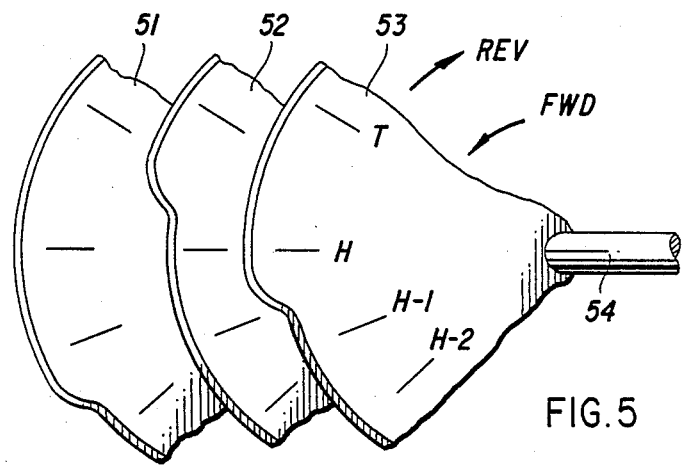
FIG. 5 is an exploded perspective view of a fragment of a parallel array of three rotary cams that have been mechanically encoded in accordance with an alternative embodiment of the invention.
Figure 5A:
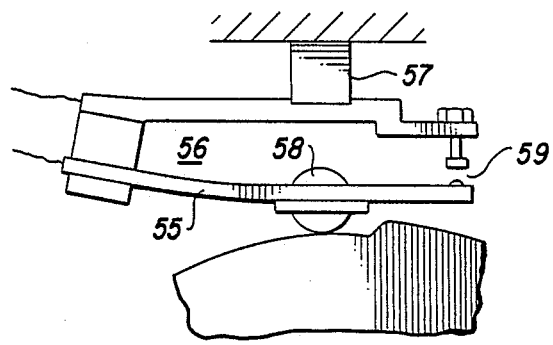
FIG. 5A is a simplified side elevation of an electrical switch that can be actuated by the lobes of a corresponding one of the cams of FIG. 5.

FIGS. 5 and 5A illustrate a mechanical technique for encoding three concentric, annular tracks having the patterns of distinct sections required to produce the order of state changes illustrated in Table 2. In this embodiment, the three tracks comprise three different cams 51, 52 and 53 mounted on a rotatable shaft 54. The profile of each cam is provided with a series of alternately low and high sections at predetermined locations, and these sections interact with a corresponding probe of an associated position sensor. As is shown in FIG. 5A, each probe comprises a relatively movable arm 55 of an electrical switch or interlock 56 which is mounted on a stationary base 57 so that a roller 58 carried by the arm 55 follows the profile of the corresponding cam. Whenever the rotatable shaft is in such an angular position that the roller 58 communicates with a high section or lobe of the cam, the arm 55 will be moved to a position that causes a set of normally open contacts 59 of the switch 56 to close, and the corresponding binary signal produced by the position sensor will then be in its 1 state.

In operation, the various states of the family of binary signals that are produced by the position sensor in any one of the above-described embodiments of the position indicating system of the present invention are decoded so as to track the movement of the movable member 21 from position to position. If the movable member were reposing in a presently known position and a new position were desired, the pilot motor 24 would be commanded to drive this member in the correct direction to reach the new position, the family of binary signals X1,X2 will change states in the sequence shown in the Binary Code columns of Table 1 (or, alternatively, the family X1,X2,X3 will change states in the sequence shown in the Binary Code columns of Table 2) as the member 21 moves from the present position toward the desired position, and the pilot motor will be commanded to stop once the binary signal decoding means indicates that the actual position of the member 21 matches the desired new position. In the presently preferred embodiment of the invention, this operation is carried out by the microcomputer 28 which is programmed to execute the steps illustrated in FIGS. 6–9 and 9A.

The first or main routine to be executed is shown in FIG. 6. On the first pass through only, this routine starts with an initializing step 61 that clears a scan timer and sets various counters, registers, flags, and variable values of the microcomputer 28 to their respective quiescent states or normal levels. Then, as is indicated in step 62, the program will wait until a pilot motor (PM) run task 63 is scheduled. The latter task is scheduled whenever the member 21 is required by the master controls 27 to move from its present position (PP) to a different or desired position (DP). (It is here assumed that the starting position of the movable member is known and is stored in the memory of the microcomputer.)

The PM run task is illustrated in FIG. 7. It begins, when scheduled, at the entry point labeled "start." The first step 71 is to determine whether or not the desired position DP is the same as the present position PP. If not, a second inquiry 72 is made to determine whether or not DP is a higher-numbered position than PP. If the answer is affirmative, the next step 73 is to load a general purpose register of the CPU (hereinafter referred to as the run command register) with "run-in-the-forward-direction" (FWD) instructions, whereas if the answer were negative, the next step 74 would be to load the same register with "run-in-the-reverse-direction" (REV) instructions. Once the run command register is loaded, the PM run task proceeds to a step 75 that outputs the instructions in this register to the PM controls 25 (FIG. 1), whereupon the pilot motor 24 is suitably energized to drive the member 21 from its starting position in the correct direction to reach DP. This completes the PM run task. Further operation of the main routine is now suspended, as indicated by step 64 in FIG. 6, until an interrupt is initiated by the automatic stop routine shown in FIG. 8 or the PM run task is rescheduled by the master controls 27 (FIG. 1) or by a "power up" routine (see FIG. 10 and its description hereinafter).

Figure 8:
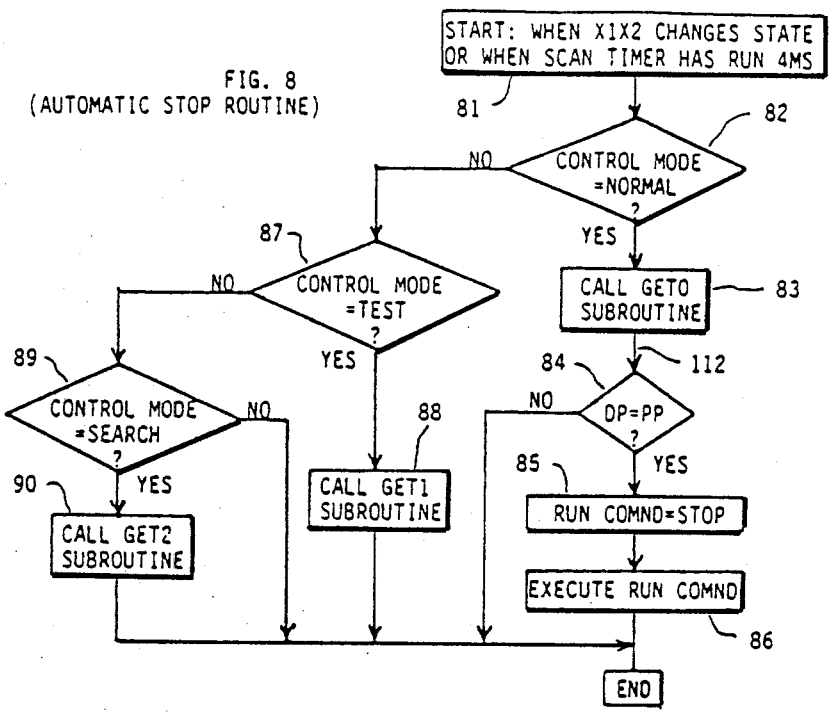

The automatic stop routine is started, at step 81 in FIG. 8, either concurrently with each state change of the family of binary signals X1,X2 produced by the position sensor 30, or whenever the scan timer has run for a specified interval (e.g., four miliseconds). Once started, the program proceeds to an inquiry point 82 where the control mode in the memory of the microcomputer is checked. During the first step 61 of the main routine (FIG. 6), the control mode was initialized to a "normal" setting. So long as the control mode remains normal, the next step 83 in the automatic stop routine is to call a GETO subroutine.

Figure 9:
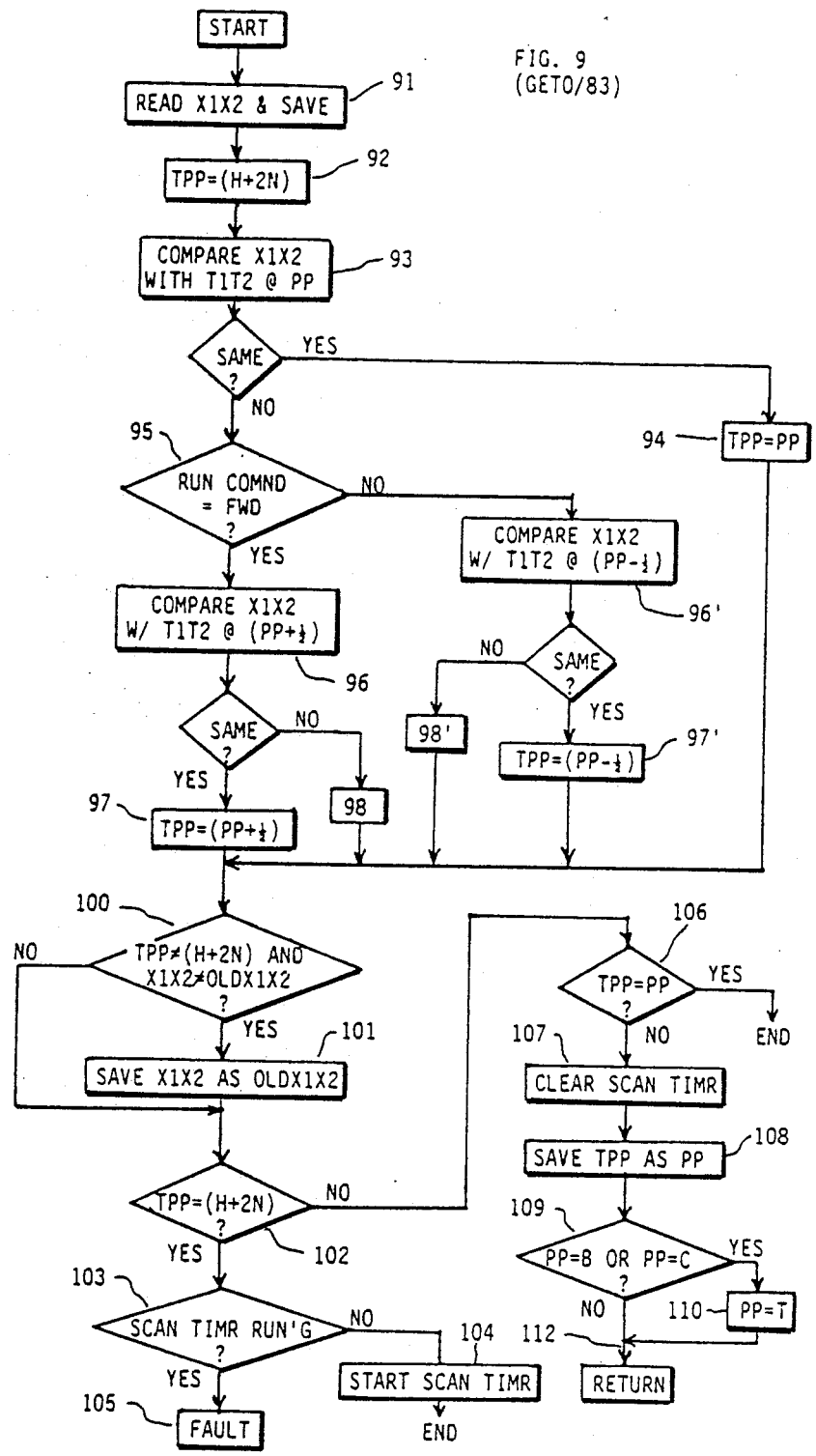

The GETO subroutine 83 is shown in FIG. 9. It starts with a step 91 of reading and saving the states of the two binary signals X1 and X2 that are then being produced by the position sensor 30. This is followed by a step 92 of loading a fictitious present position (e.g., H+2N) into a temporary register of the CPU (hereinafter referred to as the TPP register). The next step 93 of this subroutine is to compare the actual state of the family X1,X2 with the expected state of this family at the present position PP, which expected state is obtained from data stored in a look-up table corresponding to Table 1. The expected state is found in the T1,T2 columns of the latter table at the encoded step matching the value of PP stored in the microcomputer memory. If the comparison 93 reveals that X1,X2 is the same as T1,T2 at position PP, a false start of the automatic stop routine (FIG. 8) may be indicated (due, for example, to a temporary state change of either X1 or X2 not caused by the associated probe 41 or 42 detecting an actual polarity change in the encoded sections of the corresponding track). In this event, the GETO subroutine will proceed to a step 94 that reloads the TPP register with the position PP. Otherwise, a real state change is acknowledged and this subroutine proceeds to a decision point 95 that determines whether or not the state change was due to the pilot motor 24 being commanded to move the member 21 in a forward direction.

If the direction is forward, the GETO subroutine 83 proceeds to a step 96 where the actual state of X1,X2 is compared with the expected state T1,T2 at position PP+½, i.e., at the next higher-numbered encoded step in the look-up table (Table 1). Alternatively, if the direction were not forward, the reverse direction is assumed and this subroutine would proceed to a step 96' where X1,X2 is compared with T1,T2 at position PP−½, i.e., at the next lower-numbered encoded step in the look-up table. In either case, if the actual state is the same as expected, the next step 97 (or 97') is to reload the TPP register with PP+½ (or PP−½). Otherwise, the next step 98 (or 98') comprises a series of decisions that will soon be explained in conjunction with the description of FIG. 9A.

As is indicated in FIG. 9, each of the alternative steps 94, 97, 97', 98, and 98' of the GETO subroutine is followed by an inquiry 100 to determine whether or not the position that is loaded in the TPP register now differs from the fictitious position (H+2N) and the actual state X1,X2 of the family of binary signals now differs from the previous state thereof (i.e., "OLDX1,X2"). The next step 101 will save X1,X2 as OLDX1,X2 in the microcomputer memory if the answer to the inquiry 100 is affirmative. If the fictitious position were still loaded in TPP, as determined at the next inquiry point 102, this subroutine and the automatic stop routine would end, after testing the status of the scan timer at another inquiry point 103 and starting this timer, at a step 104, unless it is already running (in which case a fault 105 is signaled). If PP has been loaded into the TPP register by the step 94, as determined by yet another inquiry 106, the automatic stop program ends here. Otherwise, the GETO subroutine proceeds in turn to a step 107 in which the scan timer is cleared (i.e., turned off and reset) and to a step 108 that saves the position in TPP as the present position PP in the microcomputer memory. This is followed by an inquiry 109 to test whether or not PP is either position B or position C and, if true, by a step 110 that changes PP to the discrete position T. From here the subroutine returns on a line 112 to the automatic stop routine.

As is indicated in FIG. 8, the automatic stop routine, after each pass through the GETO subroutine 83, proceeds from the line 112 to a decision point 84 that determines whether or not there is agreement between PP and the desired position DP. If PP is the same as DP, the next step 85 of this routine is to load the run command register with "stop-the-pilot-motor" (STOP) instructions. Once this register is loaded, the stop instructions are outputted, at a step 86, to the PM controls 25, whereupon the pilot motor 24 is de-energized or "plugged." At the same time, the automatic stop routine initiates an interrupt that recycles the main routine (FIG. 6). Consequently, the PM run task (FIG. 7) begins again but ends at its first inquiry step 71 where agreement between PP and DP is confirmed. Thereafter the main routine is suspended (at step 64) until the PM run task is rescheduled.

At the particular moment of time when the stop instructions 86 are executed, the movable member 21 will be closely approaching but will not yet have actually reached the desired discrete position (DP). However, inertia of this member and of the other parts that are mechanically coupled to the motor shaft, in combination with the lateral force exerted by the load pawl 35 on the edge 34 of the body 33 (FIG. 2), will usually drive the movable member to its closest discrete position where it can repose until the PM run task 63 is rescheduled.

So long as the present position PP is not the same as DP, the automatic stop routine is completed at the decision point 84 without stopping or plugging the pilot motor. Thereafter, this routine will start again as soon as the position sensor 30 produces the next state change of X1,X2, or automatically when the scan timer, if started at the step 104 of the GET0 subroutine 83, has run for four miliseconds.

It will now be apparent that as the pilot motor 24 moves the member 21 from position to position toward its desired position, the microcomputer 28 will keep track of the actual position of the moving member. Each time the family of binary signals X1,X2 changes states, the automatic stop routine is executed, and step 108 of the GET0 subroutine 83 will update PP in the manner described above. This occurs once per discrete position between the starting and desired positions of the movable member, and also once per intervening position between consecutive discrete positions. Such intervening positions correspond, respectively, to the various ½ steps and to the steps A, B, C and D of Table 1. In normal operation, PP will be incremented (or decremented, if the member 21 were moving in its reverse direction) in ½-position steps, as implemented at the step 97 (or 97') of the GET0 subroutine (FIG. 9). However, there are certain other possibilities when the member 21 is first moved from its starting position or when it is moving through a limited portion of its travel where the position sensor 30 is scanning the transition zone of the encoded tracks. Such other possibilities are accommodated by the decisions in step 98 (or 98') which will now be described.

Figure 9A:
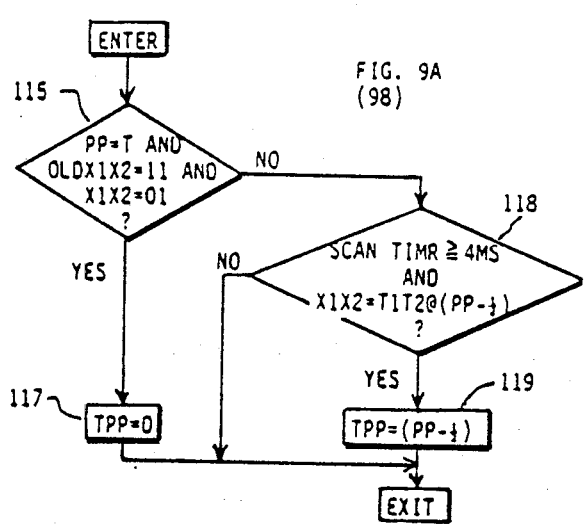

FIG. 9A shows the various decision points and other details of the step 98. Whenever the actual state of the family of binary signals X1,X2 is not the same as expected after a state change, as determined at step 96 of the GET0 subroutine 83, the program will enter step 98 and proceed to a decision point 115 that determines whether or not PP=T and the family X1,X2 is presently 01 but was previously 11. If true, as is the case when the member 21 has actually moved from position C toward position D and the polarity change of the first encoded track 31 between these two positions was sensed by the probe 41, the next step 117 is to reload the TPP register with position D. (From Table 1 and FIG. 9 it will be apparent that if the member 21 has actually moved from position B toward position T, the TPP register is reloaded with PP=T at step 94 of the GET0 subroutine, the automatic stop routine will end at the inquiry 106 of this subroutine, and on the next pass through the step 96 will reveal that X1,X2 is the same as T1,T2 at the encoded step C.)

If the answer at the decision point 115 in step 98 were negative, the program would alternatively proceed from this point to another decision point 118 that determines whether or not the scan timer has been running for at least the specified time (e.g., 4 miliseconds) and the actual state of X1,X2 matches the expected state T1,T2 at position PP−½, i.e., at the next lower-numbered encoded step in the look-up table. If true, the next step 119 is to reload TPP with PP−½. Otherwise, the program would exit the step 98 at the decision point 118 with the fictitious position still loaded in TPP, the next inquiry point 102 of the GET0 subroutine (FIG. 9) will now direct the program, via the inquiry point 103, to the timer-starting step 104 and from there to the end of the automatic stop routine (FIG. 8), and the latter routine will be repeated four miliseconds later (i.e., when the specified time interval of the scan timer expires) or when the next X1,X2 state change occurs, whichever is earlier. If the four miliseconds were to elapse before the next state change and the movable member 21 where then positioned a step behind its previous position, an affirmative answer would be obtained at the decision point 118 on the ensuing pass through the GET0 subroutine. This could happen if, upon executing the run command step 75 of the PM run task (FIG. 7), the movable member 21 were to slip backward far enough for the position sensor 30 to detect a polarity change in the encoded tracks before the drive means became effective to apply the torque required to move the member 21 in the commanded forward direction.

The details of the step 98' of the GET0 subroutine shown in FIG. 9 are similar to those shown in FIG. 9A and described above. However, in 98' the step corresponding to step 117 will reload the TPP register with position A, the decision point corresponding to point 118 will test for agreement between the actual state of X1,X2 and the expected state T1,T2 at PP+½, and the step corresponding to step 119 will reload TPP with PP+½.

For the foregoing description of FIGS. 6–9 and 9A, it was assumed that the starting position of the movable member 21 was known. In practice, the main routine (FIG. 6) is usually started without knowing for sure in which of its many discrete positions the movable member is presently reposing. Therefore means is provided for finding a predetermined home position of the movable member regardless of its original position. In the presently preferred embodiment of this invention, the means for finding the home position is implemented by programming the microcomputer 28 to perform the power up routine illustrated in FIG. 10.

Figure 10:
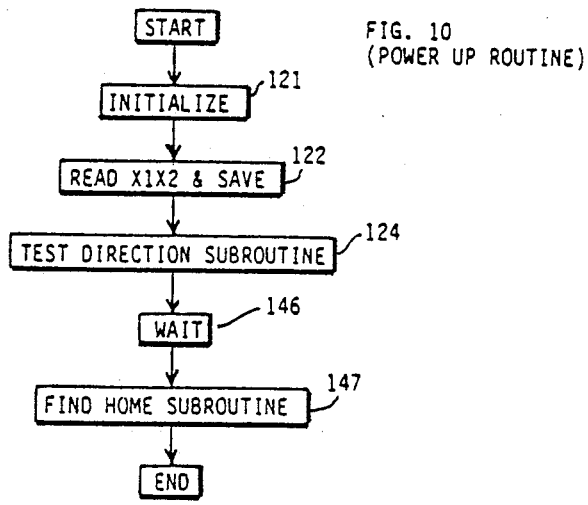
FIGS. 10-14 are flow charts that explain the presently preferred manner of decoding the family of binary signals shown in FIG. 2 and of initially finding a predetermined home position of the movable manner.

The purpose of the power up routine is to initialize the present position PP stored in the microcomputer memory and to cause the movable member 21 to be driven to the predetermined starting or home position that is herein called H. This routine starts, on command of the master controls 27, with an initializing step 121 that sets PP=H, DP=H, and control mode="test." Next, as is indicated in FIG. 10 at step 122, the original state of X1,X2 is read and saved. Then a "test direction" subroutine 124 is executed.

Figure 11:
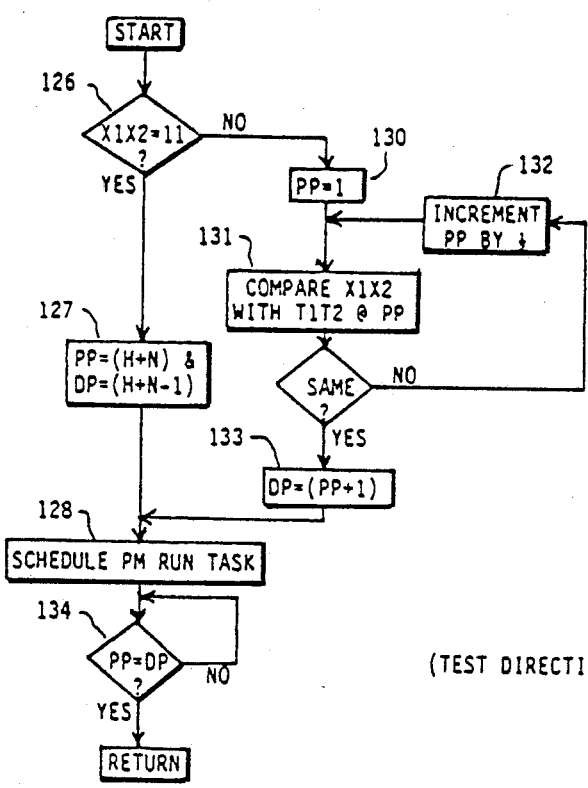

The test direction subroutine 124 is illustrated in FIG. 11. Its first step 126 is to test if X1,X2 is 11. If true, the next step 127 will arbitrarily select the last position (H+N) of the movable member as the present position PP and the next-to-last discrete position (H+N−1) as the desired position DP. Step 127 is followed by a step 128 of scheduling the PM run task (FIG. 7) which, in the manner previously described, will then start the pilot motor 24 running in the reverse direction.

Alternatively, if X1,X2 were not 11, the test direction subroutine would proceed from step 126 to a step 130 that selects the first discrete position 1 as PP. Step 130 is followed by a step 131 that references the look-up table to compare the expected state T1,T2 at encoded step PP with the original state X1,X2. If the original state is not the same as expected, the comparing step 131 will be repeated after incrementing PP by ½ at an intervening step 132. Once the expected state agrees with the original state, the next step 132 is to designate position PP+1 as the desired position DP, and this step is followed by the step 128 which then starts the pilot motor running in the forward direction.

Upon movement of the member 21 in either direction from its original position, polarity changes in its encoded tracks will be detected by the position sensor 30, and at each of the resulting state changes of the family X1,X2 produced by this sensor the automatic stop routine (FIG. 8) is started. As will soon be explained in conjunction with the description of FIG. 12, the value of PP in the microcomputer memory will be changed to the next higher (or lower) step or position during each pass through the automatic stop routine after the PM run task is scheduled by the step 128. PP is periodically checked at an inquiry point 134 in the test direction subroutine 124, and this subroutine will return to the power up routine (FIG. 10) as soon as PP is the same as DP (indicating that the movable member has advanced from its unknown original position to the next discrete position in either a reverse or a forward direction).

While the member 21 is moving in response to execution of the step 128 in the test direction subroutine, the automatic stop routine is started each time X1,X2 changes state. In this case the answer to inquiry 82 is negative and, as is shown in FIG. 8, the latter routine will proceed to a second inquiry point 87 that rechecks the control mode. So long as the control mode indicates "test," the next step 88 in the automatic stop routine is to call a GET1 subroutine.

Figure 12:
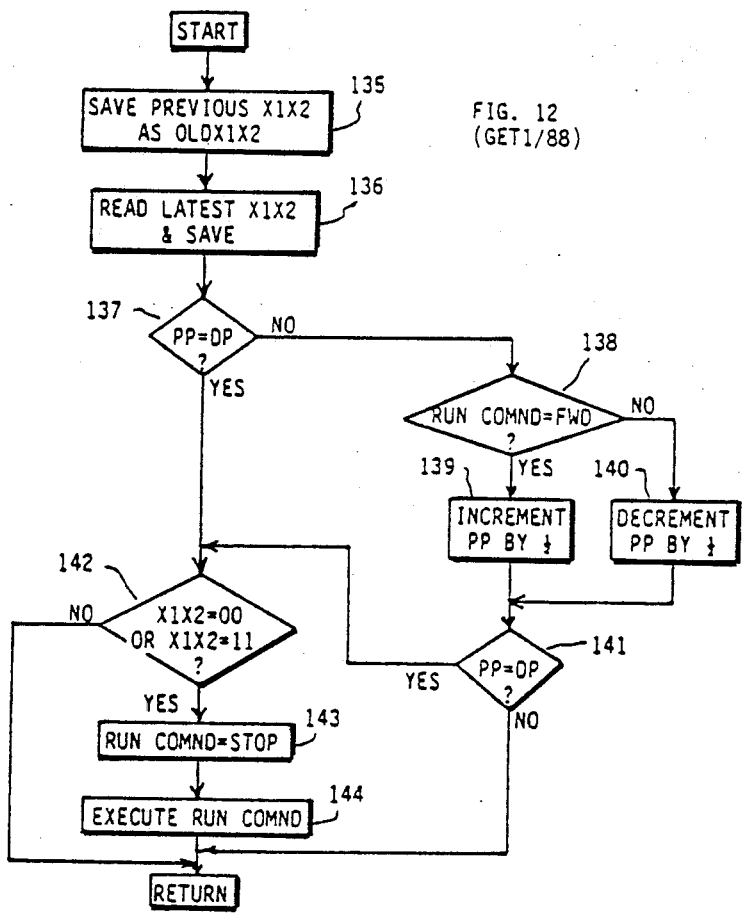

The GET1 subroutine 88 is shown in FIG. 12. It starts with a step 135 of saving X1,X2 as "OLDX1,X2" in the microcomputer memory, whereby the X1,X2 state immediately prior to the latest or actual state is remembered for later processing. The subroutine proceeds from the step 135 to a step 136 that reads and saves the actual state of X1,X2. This is followed by a first inquiry 137 to determine whether or not PP is the same as DP. If not, the subroutine proceeds to a decision point 138 that determines whether or not the state change was due to the pilot motor being commanded to move the member 21 in a forward direction. If the direction is forward, a step 139 is implemented to increment PP by $\frac{1}{2}$. Alternatively, if the direction were not forward a step 140 would be implemented to decrement PP by $\frac{1}{2}$. Both of the steps 139 and 140 are followed by another inquiry 141 that tests PP for agreement with DP. If PP is not now the same as DP, the subroutine returns to the automatic stop routine. Thereafter, the latter routine will start again as soon as the position sensor 30 produces the next state change of X1,X2.

If either of the inquiry points 137 and 141 reveals that PP is the same as DP, the GET1 subroutine 88 proceeds to a final decision point 142 that determines whether or not X1,X2 is either 00 or 11. If not, as would be the case if the movable member were originally in its position T, the program is returned to the automatic stop routine here. Otherwise, the next step 143 is to load stop instructions into the run command register. Once this is done, the stop instructions are outputted, at a step 144, to the PM controls 25, whereupon the pilot motor 24 is de-energized and the member 21 is stopped in its closest discrete position. At the same time, the automatic stop routine initiates an interrupt that recycles the main routine (FIG. 6).

As explained above in conjunction with the description of FIG. 11, the test direction subroutine 124 is completed when PP=DP, indicating that the member 21 has moved from its original position in either a forward or a reverse direction and is closely approaching the next discrete position. The next step 146 in the power up routine (FIG. 10) is to wait for a predetermined period of time (e.g., 100 miliseconds) while the drive means for the movable member responds to the stop command issued at step 144 of the GET1 subroutine 88 (FIG. 12) and the movable member comes to a full stop in the desired position. At the end of this waiting period, the power up routine proceeds to a "find home" subroutine 147.

Figure 13:
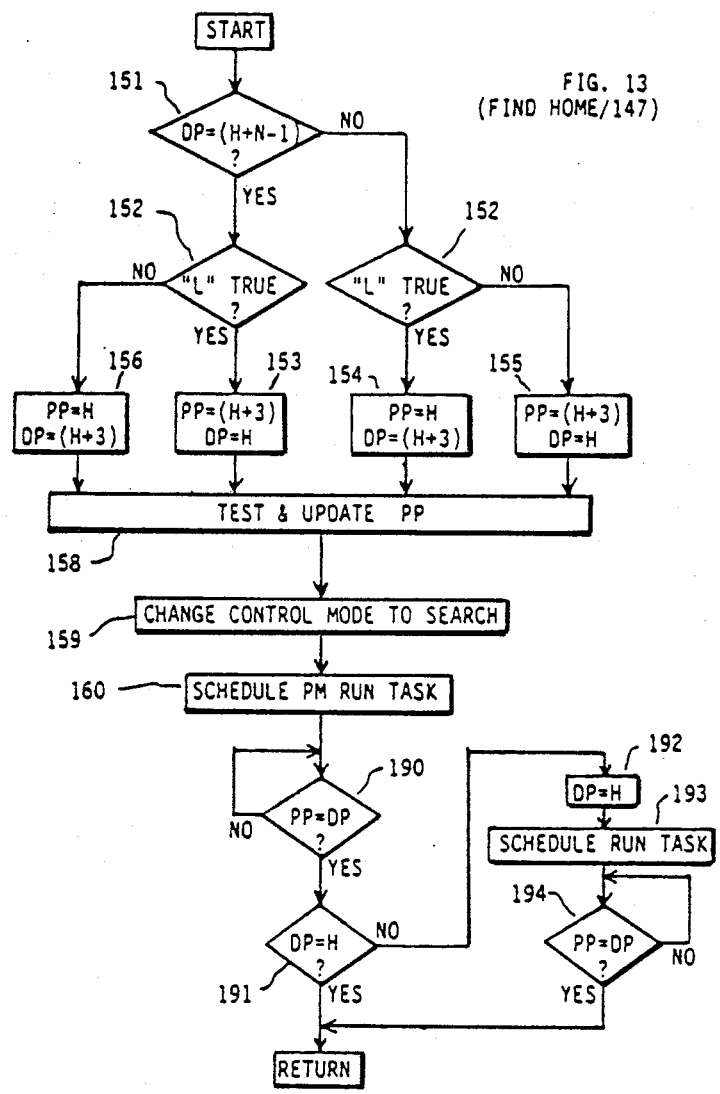

The find home subroutine is illustrated in FIG. 13. It begins at the entry point labeled "start." A first inquiry is made at 151 to determine if DP is H+N−1. The direction in which the member 21 moved in response to the execution of the previously described test direction subroutine 124 can be deduced from the answer to this inquiry: if the answer is affirmative, the reverse direction was selected; otherwise the forward direction was selected. In either case, the find home subroutine 147 next performs a logic function 152 that determines whether or not a statement "L" is true. The statement L is as follows:

| Statement "L" | | | |
|---|---|---|---|
|  | (OLDX1,X2 = 00 | AND | X1,X2 = 01), |
| OR | (OLDX1,X2 = 01 | AND | X1,X2 = 11), |
| OR | (OLDX1,X2 = 11 | AND | X1,X2 = 10), |
| OR | (OLDX1,X2 = 10 | AND | X1,X2 = 00). |

The actual data to be compared with the particular states identified in this statement are found during the last pass through the GET1 subroutine 88 (FIG. 12) where the previous value of X1,X2 was saved as OLDX1,X2 at the step 135 and the latest value of X1,X2 was read and saved at the step 136. The statement itself is preconditioned to represent the aforesaid first predetermined repetitive sequence of X1,X2 state changes that occur as the member 21 moves from position to position in a direction from either end of its normal travel toward the mid position T. Therefore, only if the member 21 actually moved toward position T will the sequence of actual state changes match one of the four possible pairs of successive states in this statement.

If, upon executing the logic function 152, the statement L is true, the find home subroutine 147 will command the pilot motor 24 to move the member 21 in the same direction as selected during the test direction subroutine 124 so as to search for a predetermined new position beyond T. In this case the logic function 152 is followed by either of two steps 153 or 154: if the test direction were reverse, as indicated by an affirmative answer to the inquiry 151, the step 153 is implemented to designate position H+3 as the present position PP and home position H as the desired position DP, whereby the member 21 will search in a reverse direction for its home position; otherwise, the step 154 is implemented to designate position H as PP and position H+3 as DP, whereby the member 21 will search in a forward direction for the position H+3.

Alternatively, if execution of the logic function 152 reveals that the statement L is false, this subroutine 147 will command the pilot motor to move the member 21 in a direction opposite to the test direction so as to search for a predetermined new position beyond T. In this case the logic functon 152 is followed by either of two steps 155 or 156: if the search direction is reverse, as indicated by negative answers to the inquiry 151 and to the logic function 152, the step 155 is implemented to designate H+3 as PP and H as DP, whereby the member 21 will again search in a reverse direction for its home position; otherwise, the step 156 is implemented to designate H as PP and H+3 as DP, whereby member 21 will search in a forward direction for position H+3.

Each of the alternative steps 153–156 is followed by a step 158 that tests PP and updates it, if necessary, by incrementing (if the search direction is reverse) or decrementing (if the search direction if forward) PP until there is agreement between the expected state T1,T2 at encoded step PP and the actual state of X1,X2. The next step 159 in the find home subroutine 147 is to change the control mode setting from test to "search." This is followed by a step 160 of scheduling the PM run task (FIG. 7) which, in the manner previously described, will then start the pilot motor 24 running in either a reverse direction (if DP is a lower-numbered position than PP, as is true when DP=H) or a forward direction (if DP is a higher-numbered position than PP, as is true when DP=H+3).

While the member 21 is moving in response to execution of the step 160 in the find home subroutine, the position sensor 30 scans the encoded tracks for polarity changes, and each time X1,X2 changes state the automatic stop routine (FIG. 8) is started. In this case the answers to both of the inquiries 82 and 87 are negative and, as is shown in FIG. 8, the latter routine proceeds to a third inquiry point 89 that rechecks the control mode. So long as the control mode indicates "search," the next step 90 in the automatic stop routine is to call a GET2 subroutine.

Figure 14:
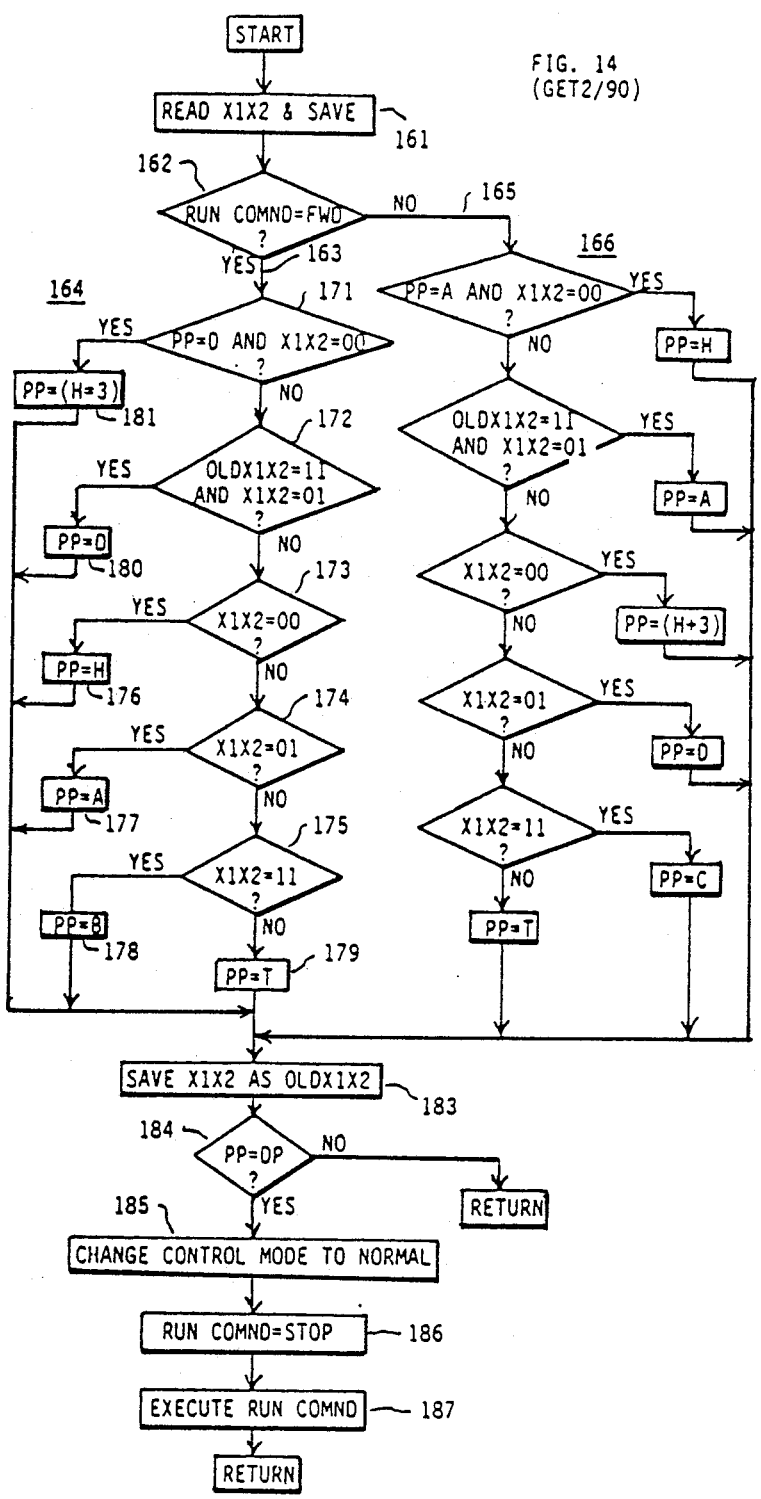

The GET2 subroutine 90 is shown in FIG. 14. It starts with a step 161 of reading and saving the actual state of X1,X2. This is followed by a first inquiry 162 to determine whether or not the state change was due to the pilot motor 24 being commanded to move the member 21 in a forward direction. If the search direction is forward, the GET2 subroutine proceeds on a line 163 to a chain of inquiry points and other steps comprising a first transition-finding logic function 164. Alternatively, if the search direction were reverse, the subroutine would proceed on a line 165 to another chain of inquiry points and other steps comprising a second transition-finding logic function 166. The logic function 164 that is effective when the search direction is forward is composed of five inquiry points 171-175 and six different PP-changing steps 176-181. The composition of the other logic function 166, which is effective when the search direction is reverse, is similar to the logic functon 164.

From the alternative logic functions 164, 166 the GET2 subroutine 90 proceeds to a step 183 of saving X1,X2 as OLDX1,X2 in the memory of the microcomputer 28. This is followed by an inquiry 184 to determine whether or not PP is the same as DP. If not, the subroutine returns to the automatic stop routine. Thereafter, the latter routine will start again each time the position sensor 30 produces a state change of X1,X2. But once PP is the same as DP, the GET2 subroutine proceeds from the inquiry point 184 to a step 185 that changes the control mode setting from "search" to "normal." This is followed by steps 186 and 187 that respectively load stop instructions into the run command register and then output such instructions to the PM controls 25, whereupon the pilot motor 24 is de-energized and the member 21 is stopped in its closest discrete position. The GET2 subroutine now returns to the automatic stop routine which initiates an interrupt that recycles the main routine (FIG. 6), and the PM run task (FIG. 7) can run again when next scheduled.

The purpose of the logic functions 164 and 166 of the GET2 subroutine is to decode the family of binary signals X1,X2 as the member 21 moves from its unknown starting position in either a forward direction toward position H+3 or a reverse direction toward position H and to find when this member traverses its transition position T. The operation of the logic function 164 will now be described for a forward search direction. The first inquiry point 171 in the logic function 164 determines if PP is D and X1,X2 is 00. Until PP=D, the answer to this inquiry will be negative, and the program proceeds to the second inquiry point 172 that determines if the statement "OLDX1,X2=11 and X1,X2=01" is true. This statement represents the third unique sequence of X1,X2 changes that occur when the member 21 moves through a limited portion of its travel, i.e., between positions A and D. It is not true so long as the member 21 is moving forward toward position T, and therefore the program proceeds from the second inquiry point to the next inquiry point 173 that determines if X1,X2 is 00. If the answer to the latter inquiry is affirmative, a step 176 will designate position H as PP. Otherwise, the program proceeds to the fourth inquiry point 174 that determines if X1,X2 is 01. If the answer to this inquiry is affirmative, a step 177 will designate A as PP. If the answer to the fourth inquiry 174 is negative, the program will continue to the fifth inquiry point 175 that determines if X1,X2 is 11. If the answer here is affirmative, a step 178 will designate B as PP, whereas if the answer is negative a step 179 will designate position T as PP.

During the first time through the transition-finding logic function 164 of the GET2 subroutine 90, either the step 177 or the step 179 is implemented, depending on whether the unknown starting position of the movable member was one of the odd numbered discrete positions or one of the even numbered discrete positions. During the next three pass throughs, three other steps will be implemented in the following sequence: either 178, 179 and 176 if step 177 were implemented first, or 176, 177 and 178 if step 179 were implemented first. This pattern is recycled as the member 21 continues to move forward to position T. But once the movable member actually reaches position T and then moves beyond T toward C, the step 178 (instead of 176) will follow the step 179. On the next pass through, in response to the polarity change detected by the first probe 41 of the position sensor 30 as the movable member 21 advances from C toward D, the answer at the second inquiry point 172 of the logic function 164 becomes true, and then D will be correctly designated as PP by a step 180. The PP data in the microcomputer memory now reflects the actual position of the movable member. As this member moves forward from D toward its next discrete position H+3, the answer at the first inquiry point 171 of the logic function 164 will be affirmative, and therefore a step 181 changes PP from D to H+3 which is the same as DP. On this pass through the GET2 subroutine 90, consequently the motor stop command is issued at the step 187 and the member 21 is stopped in the desired new position H+3.

In effect, the transition-finding logic function 164 automatically calibrates the data in the present position register of the microcomputer memory to match the real position of the movable member in response to the sequence of actual state changes of X1,X2 switching from the aforesaid first sequence (characterizing movement of member 21 toward its transition position T) to the aforesaid second sequence (characterizing movement of member 21 away from T). As is apparent in FIG. 14, the companion logic function 166 is effective when the search direction is reverse, and it will operate in a manner similar to that of the logic function 164 to find the real position of the movable member upon reaching position A after traversing position T.

Returning to FIG. 13, the remainder of the find home subroutine 147 will now be described. After the PM run task is scheduled at the step 160, PP is periodically checked at an inquiry point 190 until it is the same as DP (indicating that the member 21 has moved, in either a forward or a reverse direction, to the desired new position that was designated by one of the four alternative steps 153–156 of this subroutine), whereupon the program proceeds to an inquiry point 191 that tests whether or not DP is the home position H. If the answer were affirmative, the find home subroutine would return here to the power up routine. But if the answer is negative the program continues to a step 192 that designates position H as DP. Step 192 is followed by a step 193 of scheduling the PM run task (FIG. 7) which, in the manner previously described, will then start the pilot motor 24 running to move the member 21 in the reverse direction from H+3 to H. While the member 21 is then moving, the position sensor 30 scans the encoded tracks for polarity changes, and each time X1,X2 changes state the automatic stop routine (FIG. 8) is started. Since the control mode is now normal (see step 185 of the GET2 subroutine 90), the automatic stop routine will call the GET0 subroutine 83 which, at the step 108 (FIG. 9), updates PP from position to position until PP=H which is the same as DP. Now the step 86 (FIG. 8) issues a stop command to the drive means, and the movable member 21 will stop in its home position. At the same time an inquiry point 194 of the find home subroutine 147 (FIG. 13) determines the PP=DP, and this subroutine will return to the power up routine (FIG. 10). This completes the power up routine.

While the preferred embodiment of the invention has been shown and described by way of illustration, various modifications thereof will probably occur to persons skilled in the art. The concluding claims are therefore intended to cover all such modifications as fall within the true spirit and scope of this invention.

We claim:

1. In a system for indicating the relative physical displacement between first and second members, one of which is reciprocally movable along a given path through multiple positions with respect to the other member, which positions include a first position at one end of the normal travel of said one member, a last position at the opposite end of the normal travel, and a transition position in between said first and last positions:

(a) at least two parallel encoding tracks provided on said first member, each of said tracks being encoded to form a series of distinct sections extending generally in the direction of said given path, with the respective sections thereof being located in accordance with a predetermined pattern that differs from the pattern of the encoded sections of any other track; and (b) a position sensor including at least two probes mounted on said second member in communication, respectively, with said encoding tracks, each probe being adapted to discriminate between successive sections of the corresponding track as said one member moves from position to position;

(c) said position sensor being operative to produce a family of at least two separate binary signals the present states of which depend, respectively, on which encoded sections of said tracks said probes last communicated with, whereby the state of each of said signals will change each time the corresponding probe senses a different encoded section as said one member moves from position to position, and the predetermined patterns of the respective tracks being so selected that said family of binary signals will change states at least once as said one member moves from any one of said positions to the next position and such state changes occur in a first predetermined repetitive sequence so long as said one member is moving in a direction from either end position toward its transition position, a second predetermined repetitive sequence different than said first sequence so long as said one member is moving in a direction away from its transition position toward either end position, and a third unique sequence different than either said first or second sequence when said one member is moving through a predetermined limited portion of its travel that includes its transition position.

2. The system of claim 1 in which said first member is the same as said one member.

3. The system of claim 1 in which each of said probes is arranged to communicate with the corresponding track at a predetermined reference point when said one member is in its transition position and is effective to scan the correponding track as said one member moves between its transition position and any other position.

4. The system of claim 1 in which said encoding tracks are permanently magnetized to form said encoded sections, with successive sections of each track being oppositely poled, and in which said probes comprise magnetic polarity sensing elements.

5. The system of claim 4 in which said magnetic polarity sensing elements are Hall devices mounted so as to interact the magnetic fields emanating from the respective tracks.

6. The system of claim 1 in which said one member can be moved to at least six discrete positions including said first, last, and transition positions, only two encoding tracks are provided on said first member, said position sensor includes only two probes and is operative to produce a family of only two binary signals, which family therefore has four alternative states, and said predetermined patterns are so selected that said family will change states at two different times upon movement of said one member from any one of said discrete positions to the next discrete position and at a third time if such movement were from said transition position in either direction.

7. The system of claim 1 in which each of said binary signals is an electrical signal that alternates between relatively high and low levels.

8. The system of claim 7 in which said one member is rotatable with respect to the other member, said encoding tracks are respectively provided on concentric, annular surfaces of said first member and are permanently magnetized to form said encoded sections, with successive sections of each track being oppositely poled, and in which said probes comprise magnetic polarity sensing elements.

9. The system of claim 1 in which said one member is rotatable with respect to the other member.

10. The system of claim 9 in which said first member is the same as said one member and said encoding tracks are respectively provided on concentric, annular surfaces of said first member.

11. The system of claim 10 in which said encoding tracks are permanently magnetized to form said encoded sections, with successive sections of each track being oppositely poled, and in which said probes comprise magnetic polarity sensing elements.

12. The system of claim 1 in which means is provided for decoding said family of binary signals, said decoding means comprising
   (i) first means preconditioned to represent said first sequence of state changes,
   (ii) second means representative of said third sequence of state changes,
   (iii) third means responsive to each state change of said binary signals for finding the actual state of said family,
   (iv) fourth means for remembering the state of said family immediately prior to said actual state,
   (v) first logic means associated with said first, third and fourth means and operative to determine whether or not the sequence of actual state changes matches said first sequence, and
   (vi) second logic means associated with said second, third and fourth means and operative while said one member is moving in a given direction through said limited portion of its travel for indicating when the sequence of actual state changes switches to said second sequence.

13. The system of claim 12 in which said third sequence of state changes is realized as said one member traverses its transition position in either a forward or a reverse direction and said second logic means is operative.

14. The system of claim 12 in which additional means is provided for moving said one member from an unknown original position to a predetermined home position, said one member being coupled to controllable drive means adapted to move said one member in either a forward direction (from said first position to said last position) or in the reverse direction on command, said additional means comprising
   (i) first means operative while said one member is in its original position for finding the present state of said family of binary signals,
   (ii) direction testing means associated with said first means for commanding said drive means to move said one member one position from its original position in a selected direction,
   (iii) searching means responsive to the operation of the first logic means of said decoding means for commanding said drive means to move said one member either in said selected direction if the sequence of actual state changes matches said first sequence, or in the opposite direction if the sequence of actual state changes does not match said first sequence,
   (iv) means responsive to the operation of the second logic means of said decoding means for commanding said drive means to stop said one member in a new position beyond said transition position when the sequence of actual state changes matches said third sequence, and
   (v) means for testing if said new position is the same as said home position and for commanding said drive means to move said one member from its new position to said home position if this test is negative.

15. The system of claim 14 in which said direction testing means is operative to select the forward direction unless said present state of said family of binary signals is the same as it would be if said one member actually were in its last position, in which event the reverse direction is selected.

16. The system of claim 15 in which the state of said family of binary signals when said one member is in its first position differs from the state of said family when said one member is in its last position.

17. The system of claim 14 in which said searching means is effective to determine said new position which is between said transition and last positions unless said drive means is commanded by said searching means to move said one member in said reverse direction, in which event said new position is between said transition and first positions.

18. The system of claim 17 in which said new position is next to said transition position.

19. In a system for indicating the relative physical displacement between first and second members, one of which is reciprocally movable along a given path through multiple discrete positions with respect to the other member, which positions include a first position at one end of the normal travel of said one member, a last position at the opposite end of the normal travel, and a predetermined intermediate position between said first and last positions:
   (a) three parallel encoding tracks provided on said first member, each of said tracks being encoded to form a series of distinct sections extending generally in the direction of said given path, with the respective sections thereof being located in accordance with a predetermined pattern that differs from the pattern of the encoded sections of any other track; and
   (b) a position sensor including three probes mounted on said second member in communication, respectively, with said encoding tracks, each probe being adapted to discriminate between successive sections of the corresponding track as said one member moves from position to position;
   (c) said position sensor being operative to produce a family of three separate binary signals the present states of which depend, respectively, on which encoded sections of said tracks said probes last communicated with, whereby the state of each of said signals will change each time the corresponding probe senses a different encoded section as said one member moves from position to position,
   (d) the predetermined patterns of the respective tracks being so selected that said family of binary signals will change states at least once as said one member moves from any one of said positions to the next position and such state changes occur in a first predetermined sequence so long as said one member is moving in a direction from said first position toward its intermediate position, a second predetermined sequence so long as said one member is moving in a direction from said last position toward its intermediate position, a third predetermined sequence so long as said one member is moving in a direction away from its intermediate position toward said first position, a fourth predetermined sequence so long as said one member is moving in a direction away from its intermediate position toward said last position, and a fifth predetermined sequence when said one member is moving through a predetermined limited portion of its travel that includes its intermediate position, each of said first, second, third, fourth, and fifth sequences differing from any one of the others.

20. The system of claim 19 in which the state of said family of binary signals when said one member is in said intermediate position differs from the state of said family when said one member is in any other discrete position.

* * * * *

UNITED STATES PATENT AND TRADEMARK OFFICE
CERTIFICATE OF CORRECTION

PATENT NO. : 4,792,788
DATED : Dec. 20, 1988
INVENTOR(S) : A. K. Kumar

It is certified that error appears in the above-identified patent and that said Letters Patent is hereby corrected as shown below:

Column 10, line 3, cancel "positive" and substitute --position--

Column 19, line 32, cancel "the" and substitute --that--

Claim 5, line 3 (Col. 20, line 37) cancel "interact" and substitute --intersect--

Claim 13, line 5 (Col. 21, line 32), after "operative" add --to determine if the sequence of actual state changes matches said third sequence.--

Signed and Sealed this

Twenty-fifth Day of July, 1989

Attest:

DONALD J. QUIGG

Attesting Officer

Commissioner of Patents and Trademarks